(12) United States Patent
Khoury et al.

(10) Patent No.: US 6,768,347 B2
(45) Date of Patent: Jul. 27, 2004

(54) PRECISE PHASE DETECTOR

(76) Inventors: John Khoury, 51 Sentinel Dr., Basking Ridge, NJ (US) 07920; Jomo Edwards, 6 Fox Run Dr., Mt. Laurel, NJ (US) 08054

( * ) Notice: Subject to any disclaimer, the term of this patent is extended or adjusted under 35 U.S.C. 154(b) by 0 days.

(21) Appl. No.: 10/145,412

(22) Filed: May 12, 2002

(65) Prior Publication Data

US 2003/0210077 A1 Nov. 13, 2003

(51) Int. Cl.[7] ............................................ H03D 9/00
(52) U.S. Cl. ........................................ 327/2; 327/12
(58) Field of Search ....................................... 327/2–12

(56) References Cited

U.S. PATENT DOCUMENTS

| | | | | |
|---|---|---|---|---|
| 5,317,202 A | * | 5/1994 | Waizman | 327/156 |
| 5,767,718 A | * | 6/1998 | Shih | 327/228 |
| 5,910,741 A | * | 6/1999 | Watanabe | 327/150 |
| 6,150,855 A | * | 11/2000 | Marbot | 327/116 |
| 6,452,433 B1 | * | 9/2002 | Chang et al. | 327/202 |

* cited by examiner

*Primary Examiner*—Timothy P. Callahan
*Assistant Examiner*—Cassandra Cox
(74) *Attorney, Agent, or Firm*—Peninsula IP Group; Douglas A. Chaikin; Dwight Marshall

(57) ABSTRACT

A digital phase detector with a master stage having imbalanced latching devices with intentional input-referred offset for determining which one of a pair of input signals is leading the other and a slave stage connected to the master stage imbalanced latching devices and which slave stage is transparent when ones of the master state imbalanced latching devices are set to a logical one and which is latched and held when the master state latching devices are reset and armed for the next phase measurement.

18 Claims, 4 Drawing Sheets

US 6,768,347 B2

PRECISE PHASE DETECTOR

FIELD OF THE INVENTION

The present invention relates to a phase detector and in particular to phase detector apparatus for detecting a difference in phase between two input signals.

BACKGROUND OF THE INVENTION

Phase detectors are used in many systems such as phase lock loops, delay lock loops and clock and data recovery circuits. Typically, a delay lock loop circuit may consist of a phase detector having an output connected to a low pass filter which in turn has an output connected to a variable delay circuit. A clock input signal is applied as one input signal to the phase detector and as an input signal to the input of the variable delay circuit which in turn applies a delayed input signal to another input of the phase detector. The phase detector measures the phase of the one input signal versus the delayed input signal and produces an output that represents the phase shift between the two input signals applied to the phase detector. The low pass filter averages the output of the phase detector output and produces an output to adjust the variable delay circuit. This negative feedback signal loop settles into a steady state value that ideally achieves zero phase error at the input of the phase detector. Depending on the design, the lock can be chosen to be zero, o, 2o, etc. With conventional phase detectors, any asymmetry in the phase detector can cause the delay lock loop to create a static phase error at the input of the phase detector resulting in an error in the delay circuit setting. Thus, the design of the phase detector is an extremely critical circuit in the delay lock loop as well as other phase measurement circuits.

Phase detectors may either be a linear or nonlinear detector. The linear detector produces an output that is ideally proportional to the phase difference between the two input signals to the phase detector. In contrast, a nonlinear or digital phase detector, sometimes called a "bang bang" phase detector, produces an output that simply indicates whether one input is leading the other input. Linear phase detectors are generally used with a delay lock loop having an analog loop filter whereas a nonlinear or digital phase detector can be used with either a digital or analog loop filter.

The simplest type of nonlinear or digital phase detector is a well known master slave D flip flop logic circuit having one input signal, hereinafter referred to as an "r" signal, connected to the clock input of the flip flop and the other input signal, hereinafter referred to as a "v" signal, connected to the D input. If the rising edge of the "r" input signal leads the rising edge of the "v" input signal, the phase detector flip flop generates a "zero" output signal indicating that the "v" input signal should be advanced. If the rising edge of the "r"input signal lags the rising edge of the "v" input signal, the phase detector flip flop generates a "one" output signal indicating that the "v" input signal should be retarded. Such a digital phase detector works well if the D flip flop has zero setup time. Assuming a finite setup time, the D flip flop phase detector operating in a feedback loop will create a static phase error equal to the flip flop setup time. In low speed delay lock loop applications such a static phase error may be acceptable, however, in extremely high speed or precision applications a static phase error equal to the setup time is unacceptable.

The static phase error, even under ideal circuit conditions will occur because the D flip flop is asymmetrical with respect to the D and clock inputs. A precise digital phase detector thus requires complete symmetry in the two inputs of the digital phase detector. A prior art solution was to design a symmetrical multi-gate flip flop circuit using a multiplicity of logic gates. A problem arises in this design in that, in addition to the power dissipation of the circuit topology, the frequency of the input signals is limited by the large number of gate delays incurred for latching the decision as well as propagating the latched decision to the output.

SUMMARY OF THE INVENTION

It is an object of the invention to provide a high speed and low power phase detector with a master stage having imbalanced latching devices with intentional input-referred offset for determining which one of a pair of input signals is leading the other and which has a slave stage connected to the imbalanced latching devices and which is transparent when ones of the imbalanced latching devices are activated and which is latched and held when the imbalanced latching devices are reset for the next measurement.

It is also an object of the invention to provide a phase detector having a pair of imbalanced latching devices each having one element connected to a first master load component and each having another element connected to a second master load component wherein one of the elements are sized larger by a range of two or more times than other one of the elements for creating an input referred offset.

It is also an object of the invention to provide a phase detector having a pair of master conducting elements each connected in series with one of a pair of imbalanced latching devices wherein each master conducting element is responsive to input signals for enabling one of the imbalanced latching devices.

It is also an object of the invention to provide a phase detector having a master bias control element connected in series with a pair of master conducting elements each connected in series with an imbalanced latching device and which is enabled by a bias control signal for enabling the master conducting elements to respond to selected values of the input signals to control operation of the imbalanced latching devices.

It is also an object of the invention to provide a phase detector having a slave stage with a pair of slave load components and a first pair of slave conducting elements each in series with one of the slave load components and each having an input connected to master load components to respond to latched input signals developed by imbalanced latching devices across the master load components.

It is also an object of the invention to provide a phase detector having a slave stage with a second pair of slave conducting elements connected in a parallel configuration in series with a first pair of slave conducting elements connected to slave load components and responsive to ones of input signals for enabling operation of ones of the first pair of slave conducting elements in response to signals latched on a pair of imbalanced load devices.

In a preferred embodiment of the invention, a phase detector embodying principles of the invention includes a master stage or circuit having imbalanced latching devices with intentional input-referred offset for determining which one of a pair of input signals is leading the other and a slave stage or circuit connected to the imbalanced latching devices which is transparent when the latching devices are set to an activate state and which are latched and held when the latching devices are set to an inactivate state.

Also in accordance with an embodiment of the invention a phase detector has a pair of master imbalanced latching devices each having a pair of elements of which one latching element is sized larger than the second latching element for creating an input referred offset and are connected in a feedback configuration with pro-designed imbalance in opposite directions. A pair of master conducting elements is each connected in series with one of the pair of the master imbalanced latching devices and each is responsive to one of a pair of input signals for enabling one of the imbalanced latching devices. In addition, a master bias control element is connected in series with the pair of master conducting elements and is enabled by a bias control signal for enabling the master conducting elements to respond to selected values of the input signals. Master symmetrical circuit apparatus is connected in parallel with a master load and the pair of imbalanced latching devices and the master conducting elements and is enabled by complementary ones of the input signals for maintaining a current flow in the bias control signal element. The phase detector has a slave stage with a first pair of slave conducting elements each having an input connected to the master imbalanced latching devices to respond to latched input signals developed by the imbalanced latching devices. A second pair of slave conducting elements connected in a parallel configuration in series with the first pair of slave conducting elements and slave load components is responsive to ones of enabling input signals. In addition, a slave bias control element connected in series with the slave load components and the first and second pair of slave conducting elements responds to the bias control signal for enabling the first and second pair of slave conducting elements to respond to selected values of the input and latched input signals. A slave latching device connected across the slave load devices, latches and holds signals developed across the slave load means. Two pairs of corresponding slave circuit elements connected in a symmetrical configuration in a series relationship to the slave latching device and in parallel across the combination of the first and second pair of slave conducting elements with each pair of corresponding slave circuit elements connected to respond to complementary input signals to compensate for variations occurring in the complementary input signals controlling operation of the slave bias control element.

Also in accordance with another embodiment of the invention, a phase detector has a pair of back to back master inverters forming a latch connected in series with a pair of parallel master conducting elements each responsive to one of input signals for enabling the master latch. Slave apparatus having a combination of a parallel pair of slave connecting elements connected in series with a slave inverter to one of the master inverters is enabled by either one of the input signals for coupling an output of the one back to back inverter to the slave inverter. In addition, load balance or complementary output apparatus comprising a combination of a parallel pair of load balance connecting elements connected in series with a load balance inverter to the other master inverter is enabled by either one of the input signals for coupling an output of the other master latch inverter to the load balance inverter to act in combination with the slave apparatus to balance the digital phase detector. The phase detector also has a first pair of two series connected master conducting elements with two of the master conducting elements of one of the first pair connected between a supply voltage and the input of the slave apparatus and with two of the master conducting elements of the other first pair connected between the supply voltage and the input to the load balance apparatus and with each pair of master conducting elements responsive to both of the input signals being a logical zero for applying the supply voltage to the inputs of the slave and load balance apparatus. A second pair of two series connected master conducting elements is also provided with each one of the two series connected master conducting elements connected between ground and the input to the slave and load balance apparatus, respectively. One master conducting element of each second pair is sized in a range between two, three or more times larger than corresponding elements of the master inverters and with the other conducting element of each second pair enabled by ones of the input signals for providing intentional input-referred offset for the master inverter latch.

Also in accordance with an embodiment of the invention, a phase detector latch has a load and a pair of imbalanced conducting elements each connected to the load and each connected in a direct connected feedback configuration with pre-designed imbalance in opposite directions wherein a first one of the imbalanced conducting elements is sized in a range of two, three or more times larger than the size of the second imbalanced latching element. A master conducting element connected in series with the load and the direct connected imbalanced conducting elements is responsive to an input signal for latching the larger sized imbalanced conducting element to a predefined state.

BRIEF DESCRIPTION OF THE DRAWINGS

For a further understanding of the objects and advantages of the present invention, reference should be had to the following detailed description, taken in conjunction with the accompanying drawing figures, in which like parts are given like reference numerals and wherein.

Figure 1:
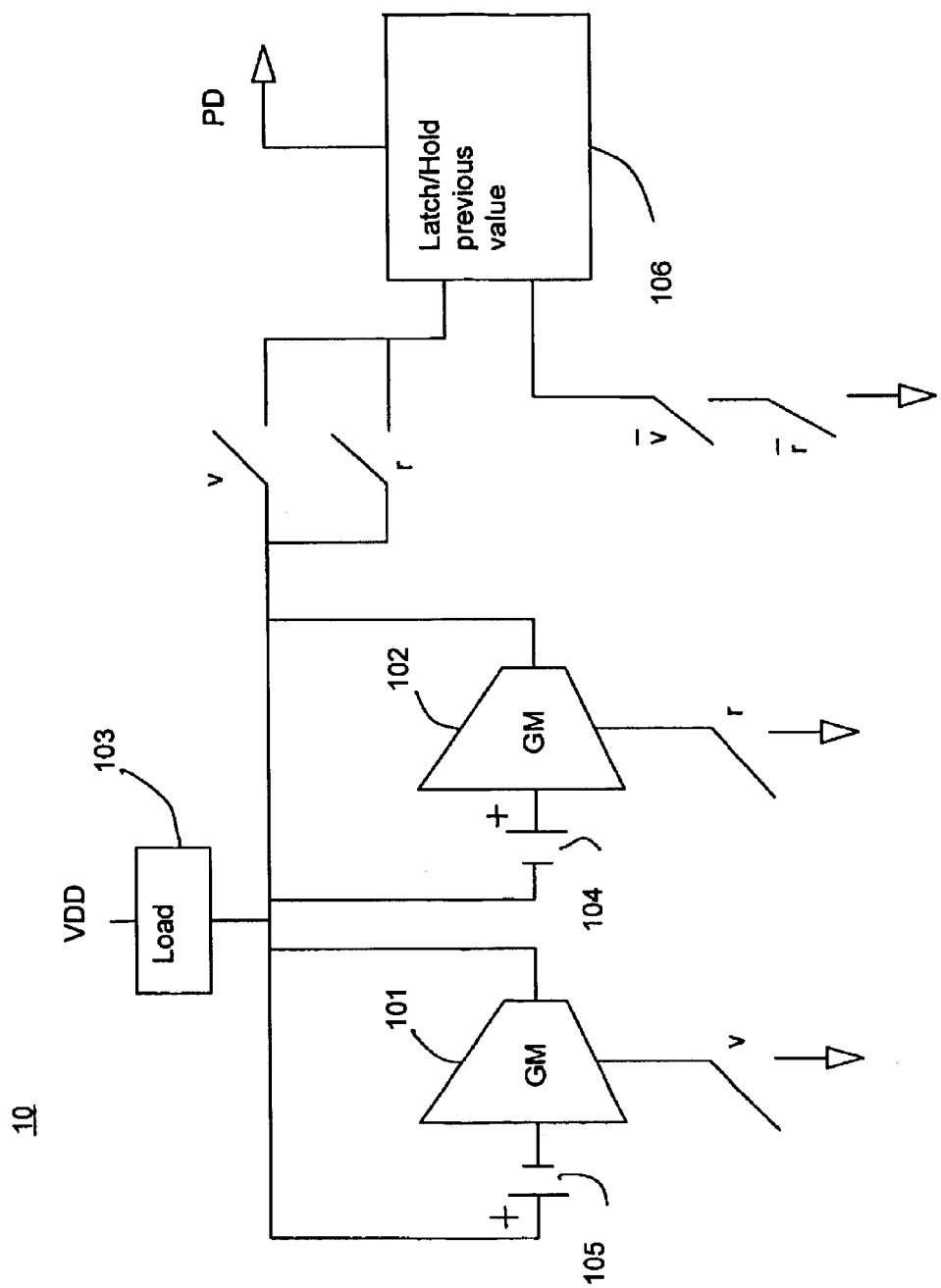
FIG. 1 is a block diagram of a phase detector in accordance with principles of the invention.

The logic component circuitry of the digital phase detector apparatus set forth in FIG. 1 through FIG. 4 of the drawing is performed by solid state and electrical elements, the individual operation of which are well known in the art and the details of which need not be disclosed for an understanding of the invention. Typical examples of these logic circuitry are described in numerous textbooks. For example, such types of logic circuitry, among others, are described by J. Millman and H, Taub in *Pulse, Digital and Switching Waveforms,* 1965, McGraw-Hall, Inc., H. Alex Romanowitz and Russell E. Puckett in *Introduction to Electronics,* 1968, John Wiley & Sons, Inc., E. J. Angelo, Jr. in *Electronic Circuits,* Second Edition, 1958, McGraw Hill, Inc. and in *The TTL Data Book for Design Engineers,* Second Edition, 1976, Texas Instruments Incorporated. Background Information on phase detectors is described by M. Johnson and E. Hudson in *A Variable Delay Line PLL for CPU-Coprocessor Synchronization,* IEEE JSSC, vol. SC-23, pp. 1218–1223, October 1988 and by M. Soyuer in *A Monolithic 2.3 Gb/s 100 mW Clock and Data Recovery Circuit in Silicon Bipolar Technology,* IEEE Journal of Solid State Circuits, vol. SC-28. pp. 1310–1313, December 1993.

DETAILED DESCRIPTION OF THE INVENTION

With particular reference to FIG. 1 of the drawing, a nonlinear or digital phase detector, hereinafter referred to as phase detector 10 consists of a master stage having latching devices 101, 102 with intentional input-referred offset for determining which one of a pair of input signals "v" and "r" is leading the other. A slave stage 106 connected to the latching devices 101, 102 is transparent when ones of the latching devices 101, 102 is set to a logical one and is latched and held when the latching devices 101, 102 are reset and armed for the next phase measurement. The master stage consists of a load component 103 which may be, but not limited thereto, a resistor, and two transconductance GM amplifiers 101 and 102, each connected in a positive feedback configuration and with intentional input-referred offset. The transconductance GM amplifiers 101 and 102 are configured as latching devices with a pre-designed imbalance in opposite directions which are shown as input-referred offset voltages 105 and 104. The switches "v" and "r" are representative of input voltage signals wherein a positive value of the input signal is a logical one representing a closed switch and a zero value is a logical zero representing an open switch. The switches "v□" and "r□" are representative of complementary values of the input voltage signals wherein a positive value of the input signals "v" and "r" is a logical zero for the complementary input signals "v□" and "r□", respectively.

The switches "v" and "r" in series with the transconductance GM latch amplifiers 101 and 102 enable or power up the GM amplifiers 101 and 102 when the input signals "v" and "r" are a logical one. When both the input signals "v" and "r" are a logical zero, both transconductance GM amplifiers 101 and 102 are powered down or reset and armed for the next measurement and the output of the master stage is the value of voltage VDD, i.e., a logical one. If the input signal "v" becomes a logical one while the input signal "r" remains a logical zero, the switches "v" and "r" are closed and open respectively, resulting in the output voltage being pulled low to a logical zero and latched with the positive feedback around transconductance GM amplifier 101. If at a later time the input signal "r" becomes a logical one while the input signal "v" remains at a logical one, the output of the master stage will stay at a logical zero. The positive feedback of the second transconductance GM amplifier 102 re-enforces that of the first transconductance GM amplifier 101. Alternatively, if the input signal "r" becomes a logical one first, the output of the master stage would be latched to a logical one. The slave stage 106 is transparent whenever the input signal "v" or "r" is a logical one and is latched and held when both input signals "r" and "v" are a logical zero. When the input signal "v" rising edge occurs before that of the input signal "v" the output PD of the slave stage 106 changes from the previous state of the slave stage 106 to a logical zero. When both the input signal "v" and "r" are a logical zero, the PD output of the slave stage 106 is held. The slave stage 106 output PD becomes a logical one in the next cycle in that the rising edge of the input signal "r" precedes that of the input signal "v".

Figure 2:
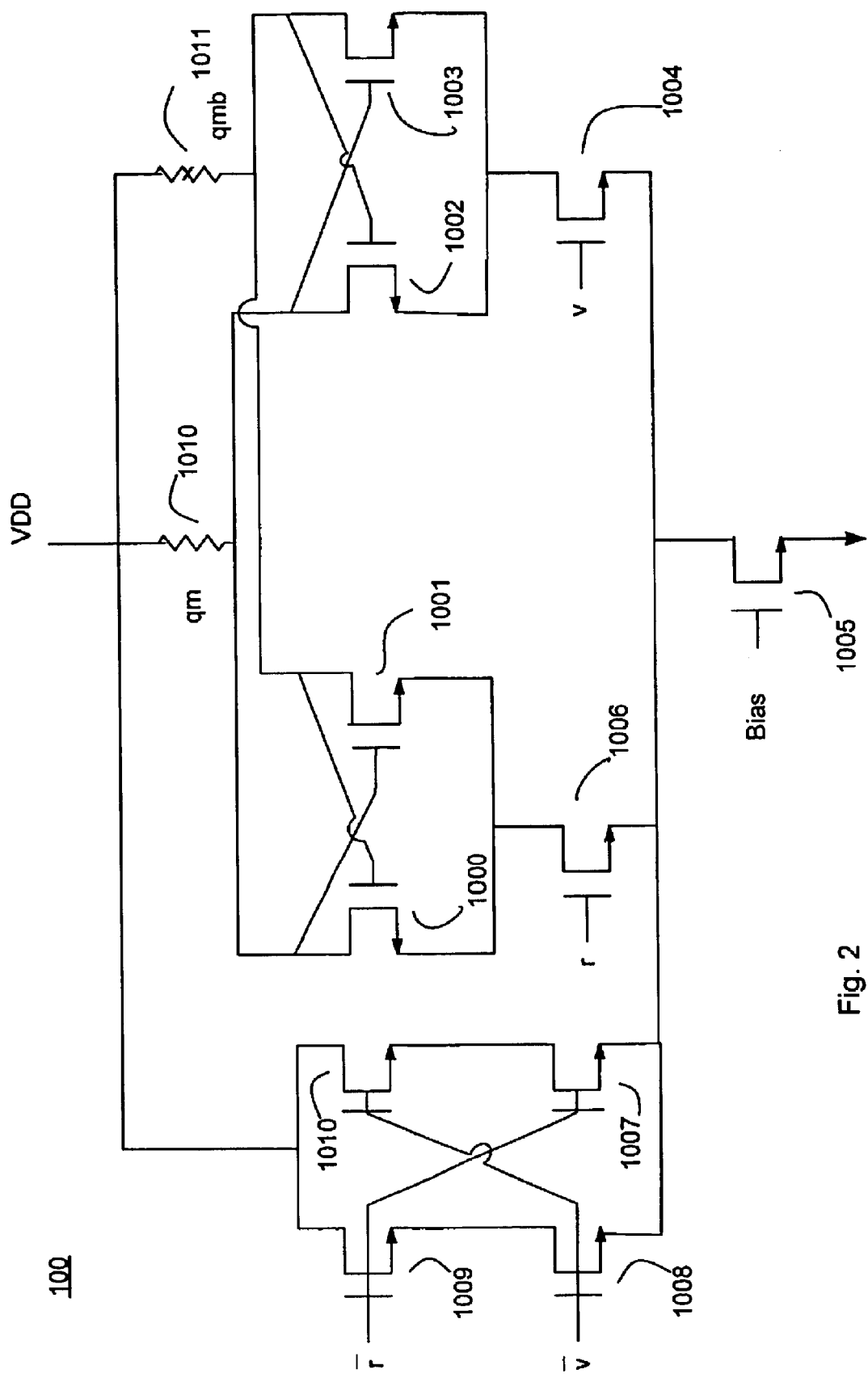
FIG. 2 is a circuit diagram of a master stage of the phase detector set forth in FIG. 1.

In one embodiment of the invention, a master stage 100, FIG. 2, of digital phase detector 10 has a load and a pair of imbalanced latching devices connected to the load with each latching device connected in a feedback configuration with pre-designed imbalance in opposite directions. The master stage load consists of master load components 1010, 1011 which may be, but not necessarily limited thereto, resistors and a pair of imbalanced latching devices 1000, 1001 and 1002, 1003 each having one element 1000, 1002 connected to a first master load component 1010 and each having another element 1001, 1003 connected to a second master load component 1011. The circuit elements may CMOS, bipolar, BiCMOS or other technologies used for their power, area and speed characteristics.

The master stage 100 imbalanced latching devices each have a pair of the first and second elements 1000, 1001 and 1002, 1003 wherein elements 1000 and 1003 are sized larger than the elements 1001 and 1002 for creating an input referred offset. Elements 1000 and 1003 of the imbalanced latching devices are sized in relationship with respect to the second elements 1001 and 1002 wherein the size of the first elements 1000 and 1003 are larger for example by a range of two or more times the size of the elements 1001 and 1002. Master stage 100 also has a pair of master conducting elements 1006 and 1004 each connected in series with one of the pair of the imbalanced latching devices and each responsive to one of input signals "r" and "v" for enabling one of the imbalanced latching devices. A master bias control element 1005 is connected in series with the pair of master conducting elements 1006, 1004 and the imbalanced latching devices and is enabled by a bias control signal for enabling the master conducting elements to respond to selected values of the input signals "r" and "v".

Master stage 100 also has master circuit apparatus connected in parallel with the master load components 1010, 1011 and the pair of imbalanced latching devices and the master conducting elements 1006, 1004 and is enabled by complementary ones "□v□" and "r□" of the input signals for maintaining a current flow in the bias control signal element 1005 when the input signals "v" and "r" are at a logical zero value. The master circuit apparatus has two pairs of corresponding master circuit elements 1009, 1007 and 1008, 1010 connected in a symmetrical relationship in parallel across the load components 1010, 1011, the pair of imbalanced latching devices and master conducting elements 1006, 1004 with each pair connected to a corresponding input one of the complementary input signals "v□" and "r□" and designed for symmetry of master stage response to the complementary input signals "v□" and "r□".

Figure 3:
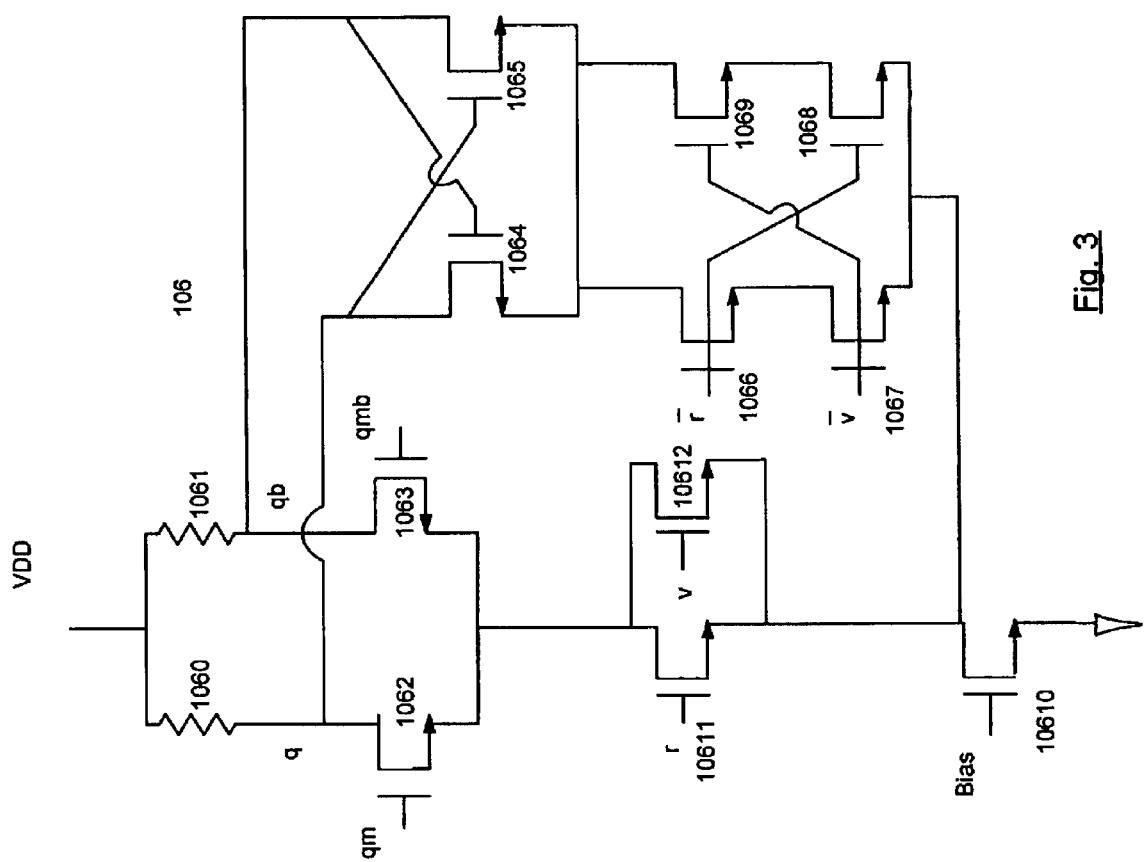
FIG. 3 is a circuit diagram of a phase detector slave stage connected to the master stage circuit set forth in FIG. 2.

The phase detector slave stage 106, FIG. 3, has a pair of slave load components 1060, 1061 and a first pair of slave conducting elements 1062, 1063 each in series with one of the slave load components 1060, 1061 and each having an input connected to the master load components 1010, 1011, FIG. 2, to respond to latched input signals "r" and "v" developed by the imbalanced latching devices of master stage 100 across the master load components 1010 and 1011. A second pair of slave conducting elements 10611 and 10612, FIG. 3, are connected in a parallel configuration in series with the first pair of slave conducting elements 1062, 1063 and slave load components 1060, 1061 and are responsive to the input signals "qm" and "qmb" for enabling operation thereof. Slave bias control element 10610 is connected in series with the slave load components 1060, 1061 and the first and second pair of slave conducting elements 1062, 1063 and 10611, 10612 and is responsive to the bias control signal for enabling the first and second pairs of slave conducting elements 1062, 1063 and 10611, 10612 to respond to selected values of the input signals "qm", "qmb", "r", "v". The stave stage 106 also has a slave latching device consisting of elements 1064 and 1065 connected in parallel with the first and second conducting elements 1062, 1063 and 10611, 10612 for latching and holding signals "q" and "qb" developed across the slave load components 1060 and 1061. Two pairs of corresponding slave circuit elements 1066, 1068 and 1067, 1069 are connected in a symmetrical relationship in series with the slave latching device 1064, 1065 and in parallel across the combination of the first and second pair of slave conducting elements 1062, 1063 and 10611, 10612 with each pair of corresponding slave circuit elements connected to a corresponding input one of the complementary input signals "v□" and "r□" and designed for symmetry of the slave stage response to complementary input signals "v□" and "r□".

When the input signals "r" and "v" to the phase detector 10 are both a logical zero, FIG. 2, the master stage imbalanced latches elements 1000, 1001 and 1002 1003 are disabled and armed for the next phase measurement and both "qm" and "qmb" are a logical one equal to the supply voltage VDD. Under this condition, the "q" and "qb" outputs of the slave stage 106, FIG. 3, are latched at the previous state. If the input signal "r", FIG. 2, becomes a logical one while the input signal "v" remains at a logical zero, the latch element 1000 being sized larger than the latch element 1001 conducts and causes the master stage output "qm" to change to a logical zero while the output "qmb" remains at a logical one. With the input signal "r" being a logical one, the slave stage 106, FIG. 3, is transparent resulting in the slave state outputs "q" and "qb" being a logical one and zero respectively. If the input signal "v" subsequently becomes a logical one while the input signal "r" remains a logical one, the master stage, FIG. 2, remains unchanged since the master stage second latch elements 1002, 1003 serve to reinforce the existing state of the master stage 100. When both input signals "r" and "v" return to the logical zero state, the slave stage 106, FIG. 3, latches the slave output signals "q" and "qb" to the logical one and zero states, respectively and the master stage resets with "qm" and "qmb" becoming a logical one.

If the input signals "r" and "v" both become a logical one at exactly the same instant in time, the two master stage imbalanced latch elements 1000, 1001 and 1002, 1003, FIG. 2, are activated simultaneously resulting in a latch without imbalance. The output of the master stage 100 is then determined by noise. Thus, the metastable point occurs in the master stage 100 when both input signals "r" and "v" are in phase, exactly where it is desired. When the input signals "r" and "v" are fifty percent duty and 180 degrees out of phase, the master stage 100 will not change state and the slave stage 106 will stay transparent. This will result in a phase detector output that is temporarily stuck at the previous value which is either an advance or retard thereby forcing the delay lock loop to move away from this phase alignment. The delay lock loop negative feedback will then cause the clocks to become in phase by either advancing or retarding the input signal "v" as desired.

A bipolar implementation of the digital phase detector would follow the same basic technology as a CMOS design. The imbalance of the master stage imbalance latches could be implemented by varying the emitter areas of the latch elements or by placing emitter degeneration in only one side of each master stage latch.

Figure 4:
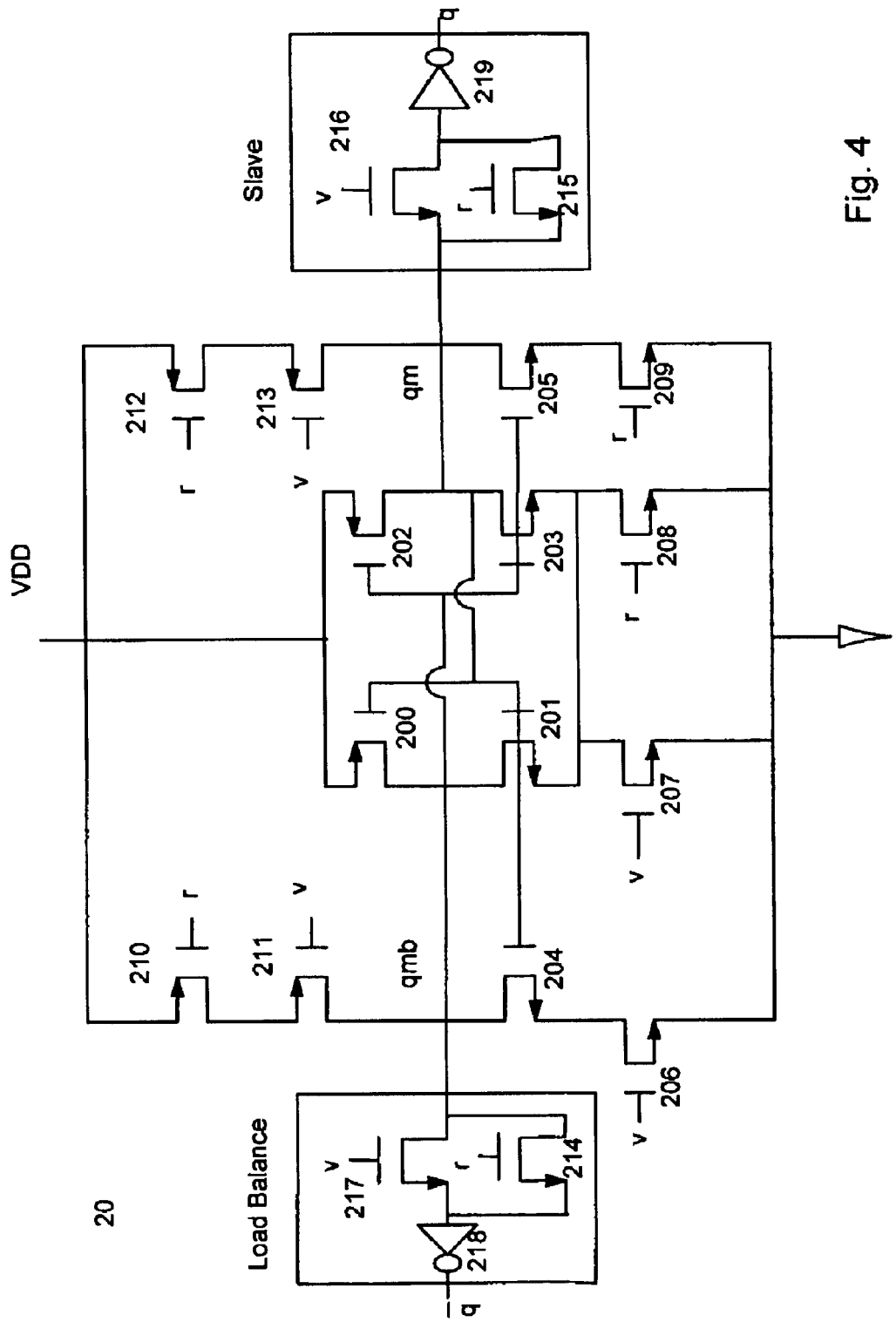
FIG. 4 is a circuit diagram of another embodiment of the phase detector set forth in FIG. 1.

In another embodiment of the invention, a phase detector 20 set forth in FIG. 4 of the drawing has a pair of back to back master inverters 200, 201 and 202, 203 forming a balanced latch and connected in series with a pair of parallel conducting elements 207 and 208 each responsive to one of the input signals "v" and "r" for enabling the back to back master stage latch comprised of elements 200, 201 and 202, 203. The master stage latch is selectively activated and unbalanced when the input signals "r" or "v" become a logical one. Slave stage apparatus consisting of a combination of a parallel pair of slave stage connecting elements 216, 215 connected in series with a slave stage inverter 219 to one of the back to back master stage inverters 202, 203 is enabled by the input signals "v" or "r" for coupling a latched output of the inverter 202, 203 to the slave stage inverter 219. The phase detector 20 also has load balance apparatus for a complementary output "q□" consisting of a combination of a parallel pair of load balance connecting elements 217, 214 connected in series with a load balance inverter 218 to the other back to back master inverter 200, 201 and is enabled by the input signals "v" or "r" for coupling an output of the other back to back master inverter 200, 201 to the load balance inverter 218 to act in combination with the slave apparatus to balance the phase detector 20.

Phase detector 20 has a first pair of two series connected master conducting elements wherein two series connected elements 212 and 213 are connected between a supply voltage VDD and the input of the slave apparatus. The other two series connected elements 210 and 211 are connected between the supply voltage VDD and the input to the load balance apparatus. The master conducting elements 210, 211 and 212, 213 of the first pair are responsive to both of the input signals "r" and "v" being a logical zero for applying the supply voltage as a logical one to the inputs of the slave and load balance apparatus. A second pair of two series connected master conducting elements 205, 209 and 204, 206 are provided with two series connected master conducting elements 205 and 209 connected between ground and the input to the slave apparatus and with two series connected master conducting elements 204 and 206 connected between ground and the input of the load balance apparatus. Conducting elements 204 and 205 each having an input connected with a corresponding one of elements 201 and 203 of the back to back inverters are sized two or more times larger than conducting elements 201 and 203 of the back to back inverters and with the other conducting element 206, 209 of each second pair are enabled by a different one of the input signals "v" and "r" for providing intentional input-referred offset for the back to back master inverter latch elements.

Phase detector 20 has a master stage with one balanced latch having conducting elements 200, 201, 202 and 203. The master stage latch is activated with input signal "v" via element 207 and is unbalanced with elements 206, 204 when the input signal "v" leads the input signal "r". If the input signal "r" leads the input signal "v", the master stage latch is activated via element 208 and unbalanced in the opposite way via elements 205, 209. The slave stage apparatus has two parallel connected N-channel transistors 216 and 215 followed by a CMOS inverter 219 connected to the "q" output. The unconnected CMOS inverter 218 and parallel connected N-channel transistors 217 and 214 of the load balance apparatus are simply to balance the loading of the digital phase detector apparatus and could provide a complementary signal "q□" if desired. When the input signals "v" and "r" are a logical zero, the cross connected master stage back to back inverters are disconnected from ground to disable them and the master stage outputs "qm" and "qmb" have a logical one state equal to the value of the supply voltage VDD. If the input signal "r" becomes a logical one while the input "v" remains a logical zero, the master stage latch is powered up and a conducting element, a NMOS transistor 205 connected to one of the back to back inverters is activated from the "qm" output to ground to unbalance the corresponding inverter latch. The back to back inverter latch consisting of conducting elements 200, 201, 202 and 203 will pull output "qm" to a logical zero and the slave apparatus will be in the transparent state forcing "q" to be a logical one. If the input signal "v" then becomes a logical one, the latched state of the master latch will remained unchanged. When both input signals "v" and "r" become a logical zero, the slave stage apparatus "q" output is held dynamically on the gate capacitance of the inverter element 219 and the master stage enters the pre-charge mode wherein "q" and "qm" are pulled to a logical one.

In accordance with principles of the invention, a digital latch, for example one of the master stage latches set forth in the digital phase detector 100, FIG. 2, has a load component and a pair of imbalanced conducting elements 1000 and 1001 each connected to the load component and each connected in a direct connected feedback configuration with pre-designed imbalance in opposite directions wherein a first one of the imbalanced conducting elements 1000 is sized larger than the size of the second imbalanced latching element 1001. The digital detector latch has a master conducting element 1006 connected in series with the load component and the direct connected imbalanced conducting elements 1000 and 1001 and which is responsive to an input signal for latching the larger sized imbalanced conducting element 1000 to a predefined state.

It is obvious from the foregoing that the facility, economy and efficiently of phase lock loops, delay lock loops and clock and data recovery circuits are improved by a nonlinear or digital phase detector having latching devices with intentional input-referred offset for determining which one of a pair of input signals is leading the other and slave apparatus connected to the latching devices which is transparent when ones of the latching devices is set to a logical one and which is latched and held when the latching devices are reset. While the foregoing detailed description has described several embodiments of a nonlinear or digital phase detector, it is to be understood that the above description is illustrative only and is not limiting of the disclosed invention. Particularly other configurations of master stage imbalanced latching devices are within the scope and sprit of this invention. For example, the disclosed phase detector might be used to tell which of two events is first in time. Thus, the invention is to be limited only by the claims set forth below.

What is claimed is:

1. A phase detector comprising:

master means having latching devices with intentional input-referred offset for determining which one of a pair of input signals is leading the other, wherein the master means comprises a load and a pair of latching devices connected to the load, each of the latching devices being connected in a feedback configuration with pre-designed imbalance in opposite directions; and slave means connected to the latching devices which is transparent when ones of the latching devices have detected a lead/lag between the input signals and which are latched and held when the latching devices are in the reset state.

2. The phase detector set forth in claim 1 wherein the master means comprises:

master load components, and a pair of imbalanced latching devices each having one element connected to a first master load component and each having another element connected to a second master load component.

3. The phase detector set forth in claim 2 wherein each imbalanced latching device comprises:

a pair of the first and second elements wherein each first element is sized larger than the second element for creating an input referred offset.

4. The phase detector set forth in claim 3 wherein each imbalanced latching device comprises:

first elements sized in relationship with respect to the second elements wherein a size of the first elements is in a range of two or more times the size of the second elements.

5. The phase detector set forth in claim 4 wherein the master means comprises:

a pair of master conducting elements each connected in series with one of the pair of the imbalanced latching devices and each responsive to one of the input signals for enabling one of the imbalanced latching devices.

6. The phase detector set forth in claim 5 wherein the master means comprises:

a master bias control element connected in series with the pair of master conducting elements and enabled by a bias control signal for enabling the master conducting elements to respond to selected values of the input signals.

7. The phase detector set forth in claim 6 wherein the master means comprises:

master circuit means connected in parallel with the master load and the pair of imbalanced latching devices and the master conducting elements and enabled by complementary ones of the input signals for maintaining a current flow in the bias control signal element.

8. The phase detector set forth in claim 7 wherein the master circuit means comprises:

two pairs of corresponding master circuit elements connected in a symmetrical relationship in parallel across the pair of imbalanced latching devices and master conducting elements with each pair connected to a corresponding input one of the complementary input signals to create the same response from the complementary input signals.

9. The phase detector set forth in claim 8 wherein the slave means comprises:

a pair of slave load components, and a first pair of slave conducting elements each in series with one of the slave load components and each having an input connected to the master load components to respond to latched input signals developed by the imbalanced latching devices across the master load components.

10. The phase detector set forth in claim 9 wherein the slave means comprises:

a second pair of slave conducting elements connected in a parallel configuration in series with the first pair of slave conducting elements members and slave load components and responsive to ones of the input signals for enabling operation of ones of the first pair of slave conducting elements.

11. The phase detector set forth in claim 10 wherein the slave means comprises:

a slave bias control element connected in series with the slave load components and the first and second pair of slave conducting elements and responsive to the bias control signal for enabling the first and second pair of slave conducting elements to respond to selected values of the input and master state latched signals.

12. The phase detector set forth in claim 11 wherein the slave means comprises:

a slave latching device connected across the slave load components for latching and holding signals developed across the slave load means.

13. The phase detector set forth in claim 12 wherein the slave means comprises:

two pairs of corresponding slave circuit elements connected in a symmetrical relationship in a series relationship to the slave latching device and in parallel across the combination of the first and second pair of slave conducting elements with each pair of corresponding slave circuit elements connected to a corresponding one of the complementary input signals to create the same response from the complementary input signals.

14. The phase detector set forth in claim 1 wherein the master means comprises a pair of back to back master inverter latches connected in series with a pair of parallel conducting elements each responsive to one of the input signals for enabling the back to back master inverter latches.

15. The phase detector set forth in claim 14 wherein the slave means comprises:

a combination of a parallel pair of slave connecting elements connected in series with a slave inverter to one of the back to back master inverter latches and enabled by ones of the input signals for coupling an output of the one back to back inverter to the slave inverter.

16. The phase detector set forth in claim 15 further comprises:

a load balance means comprising a combination of a parallel pair of load balance connecting elements connected in series with a load balance inverter to the other back to back master inverter latch and enabled by ones of the input signals for coupling an output of the other back to back master latch inverter to the load balance inverter to act in combination with the slave means to balance the phase detector master means.

17. The phase detector set forth in claim 16 wherein the master means comprises:

a first pair of two series connected master conducting elements with two of the master conducting elements of one of the first pair connected between a supply voltage and the input of the slave means and with two of the master conducting elements of the other first pair connected between the supply voltage and the input to the load balance means and with each pair of master conducting elements responsive to both of the input signals being a logical zero for applying the supply voltage as a logical one to the inputs of the slave and toad balance means.

18. The phase detector set forth in claim 17 wherein the master means comprises:

a second pair of two series connected master conducting elements with each connected between ground and input to the slave and load balance means and with one conducting element of each second pair being sized in a range between two and three times larger than elements of the back to back master inverter latches and with the other conducting element of each second pair enabled by a different one of the input signals for providing intentional input-referred offset for the back to back master inverter latches.

* * * * *